United States Patent [19]
Wang

[11] Patent Number: 6,159,840
[45] Date of Patent: Dec. 12, 2000

[54] FABRICATION METHOD FOR A DUAL DAMASCENE COMPRISING AN AIR-GAP

[75] Inventor: Jyh-Ming Wang, Hsinchu Hsien, Taiwan

[73] Assignees: United Semiconductor Corp.; United Microelectronics Corp., both of Hsinchu, Taiwan

[21] Appl. No.: 09/439,930

[22] Filed: Nov. 12, 1999

[51] Int. Cl.[7] .............................. H01L 21/4763
[52] U.S. Cl. .................. 438/618; 438/619; 438/421; 438/422
[58] Field of Search .................. 438/619, 421, 438/422

[56] References Cited

U.S. PATENT DOCUMENTS

| | | | |
|---|---|---|---|
| 4,356,211 | 10/1982 | Riseman | 427/85 |
| 4,888,300 | 12/1989 | Burton | 437/61 |
| 5,306,659 | 4/1994 | Beyer et al. | 437/64 |
| 5,310,700 | 5/1994 | Lien et al. | 437/195 |
| 5,882,996 | 3/1999 | Dai | 438/597 |
| 5,935,868 | 8/1999 | Fang et al. | 438/692 |

*Primary Examiner*—Matthew Smith
*Assistant Examiner*—Renzo Rocchegiani
*Attorney, Agent, or Firm*—Thomas, Kayden, Horstemeyer & Risley

[57] ABSTRACT

A fabrication method for a dual damascene structure comprising an air-gap is provided. The method includes forming sequentially a first dielectric layer, a stop layer and a second dielectric layer on a substrate comprising a first metal layer. The first and the second dielectric layers are then defined to form a via. opening exposing the first metal layer and an opening in a predetermined position on the first and second dielectric layers. An oxide layer is then formed on the second dielectric layer covering the opening and forming a gap. The oxide layer and the second dielectric layer are then defined to form a trench, which exposes the first metal layer. A second metal layer and a via plug are then formed in the trench and the via. opening, wherein the second metal layer and the first metal layer are electrically connected through the via plug.

13 Claims, 4 Drawing Sheets

FABRICATION METHOD FOR A DUAL DAMASCENE COMPRISING AN AIR-GAP

BACKGROUND OF THE INVENTION

1. Field of the Invention

The present invention relates to a fabrication method for a dual damascene structure. More particularly, the present invention relates to a fabrication method for a dual damascene structure comprising an air-gap.

2. Description of the Related Art

The escalating demand of a higher integration in a semiconductor device has led to the development of integrated circuits having multiple levels of interconnects. In such an integrated circuit, the conductive material on one interconnect level is electrically insulated from the conductive material on another interconnect level by a dielectric material.

As the downscaling of the device dimensions continues, the distance between the metal conductive lines also decreases to increase the integration density. A reduced distance between the metal conductive lines, however, generates parasitic capacitance, causing the distributed capacitive load of the metal conductive line to retard the signal propagation. A capacitive coupling between the neighboring metal conductive lines leading to the problem of cross-talk may arise. The generation of the parasitic capacitance, as a result, not only delays the signal propagation of the metal interconnect, but may also cause an unpredictable logic error.

SUMMARY OF THE INVENTION

Based on the foregoing, a fabrication method for a dual damascene structure is provided, wherein a dielectric material comprising an air-gap is employed to lower the dielectric constant of the dielectric material, to reduce the parasitic capacitance and to increase the speed of signal propagation in the metal interconnect.

The present invention provides a fabrication method for a dual damascene comprising an air-gap, wherein a dielectric layer is formed on a substrate comprising a first conductive line. An opening is then formed in the dielectric layer, exposing the first conductive line. Concurrently, a gap is formed in a pre-determined position on the dielectric layer. A dielectric material is then formed on the dielectric layer, followed by forming a trench in the dielectric material and the dielectric layer, exposing the first conductive line. The opening and the trench are then filled with a conductive material forming a second conductive line and a via, wherein the first conductive line is electrically connected with the second conductive line through the via.

The present invention further provides a fabrication method for a dual damascene structure comprising an air-gap in which a first dielectric layer, a stop layer and a second dielectric layer are sequentially formed on a substrate comprising a first metal layer. The first and the second dielectric layers are then defined to form a via opening, which exposes the first metal layer and to form an opening. Thereafter, an oxide layer is formed on the second dielectric layer covering the opening and forming a gap. The oxide layer and the second dielectric layer are further defined to form a trench and to expose the first metal layer. A second metal layer and a via plug are subsequently formed in the trench and the via opening, wherein the first conductive line is electrically connected to the second conductive line through the via plug.

The present invention provides a method to form an air-gap in the dielectric layer between the conductive lines. The dielectric constant of the dielectric layer is thus lower to improve the issue of parasitic capacitance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

One approach to resolve the problem of parasitic capacitance in semiconductor manufacturing is to form a dielectric material with a low dielectric constant between the metal conductive lines. The dielectric material includes a chemical-vapor deposited oxide layer (with a dielectric constant of about 4 to 4.2), fluorosilicate glass (FSG), hydrogen silsesquioxane (HSQ) (with a dielectric constant of about 2 to 3) and air, whose dielectric constant of about 1 is the lowest In the present invention, an air-gap is thus formed in the dielectric layer between the metal conductive lines. Using the low dielectric constant characteristic of air, the dielectric constant of the dielectric layer is lowered to prevent the issue of parasitic capacitance.

Figure 1:
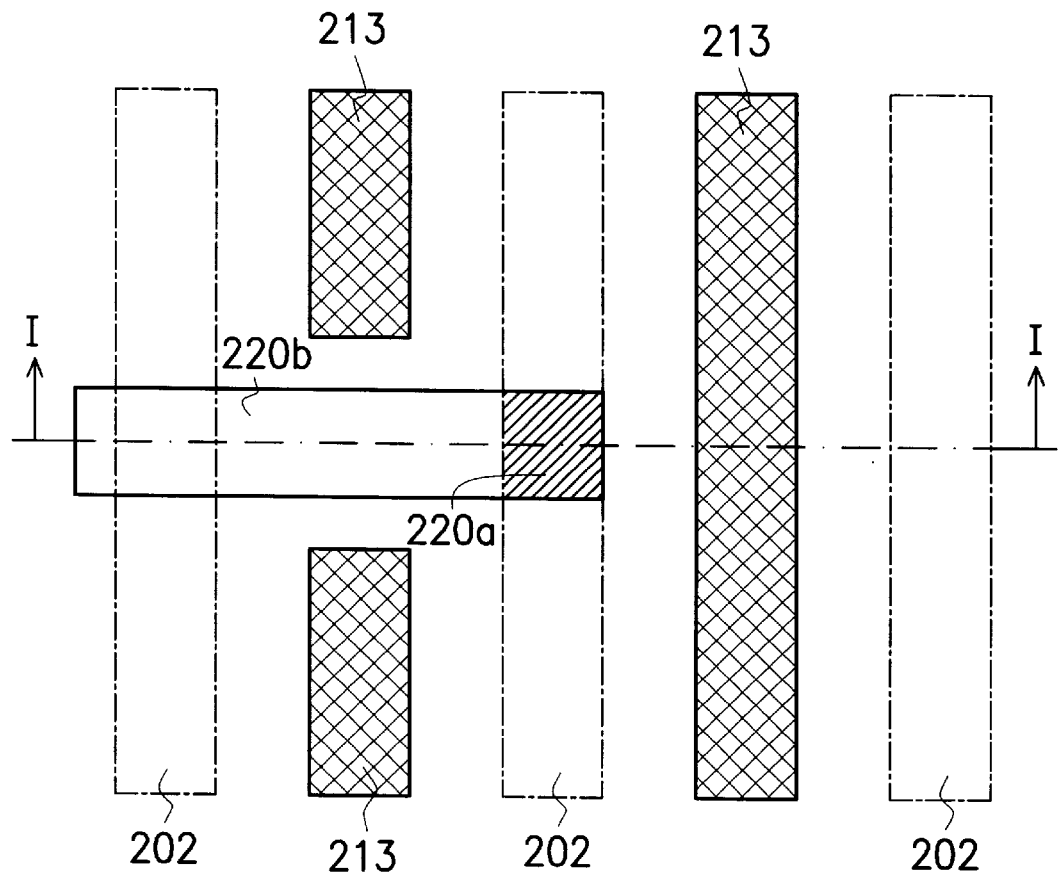
FIG. 1 is a schematic diagram showing the arrangement of a dual damascene structure comprising an air-gap according to the preferred embodiment of the present invention.

FIG. 1 is a schematic diagram showing the arrangement of a dual damascene structure comprising an air-gap according to the preferred embodiment of the present invention. FIGS. 2A to 2G are schematic, cross-sectional views of FIG. 1 along the line I—I, illustrating the manufacturing of a dual damascene structure comprising an air-gap according to the preferred embodiment of the present invention.

Figure 2A:
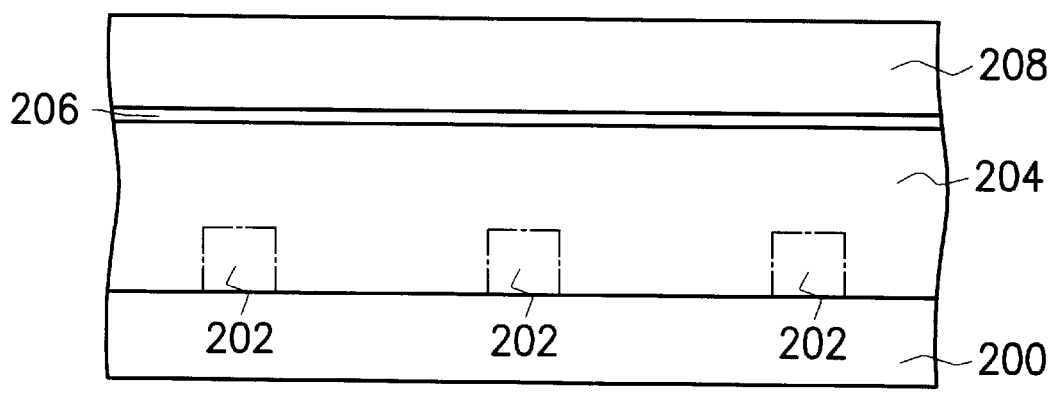
FIGS. 2A to 2G are schematic, cross-sectional views of FIG. 1 along the line I—I illustrating the manufacturing of a dual damascene structure comprising an air-gap according to the preferred embodiment of the present invention.

Referring to FIG. 1 and FIG. 2A, a metal layer 202 is formed on the substrate 200 as the bottom layered conductive line of the metal interconnect. A dielectric layer 204 is further formed covering the metal layer 202 and the substrate 200. The dielectric layer 204, such as an oxide layer or a boron phosphosilicate glass, is formed by, for example, chemical vapor deposition. Thereafter, a stop layer 206 is formed on the dielectric layer 204, for example, a chemically vapor deposited silicon nitride layer. A dielectric layer 208, for example, an oxide layer, is further formed on the stop layer 206.

Figure 2B:
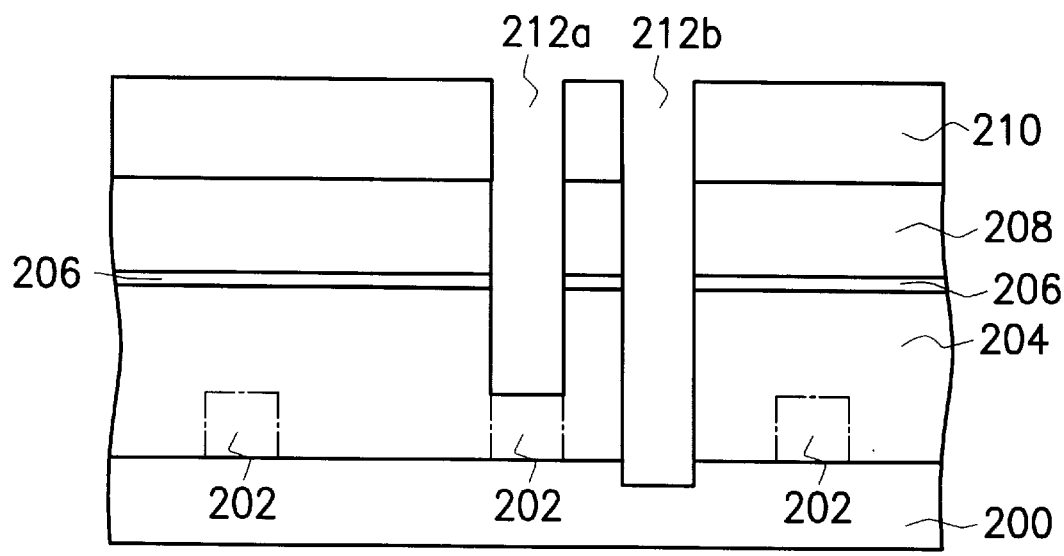

Referring to FIG. 2B and FIG. 1, a photoresist layer 210 is formed on the dielectric layer 208. The dielectric layer 208, the stop layer 206 and the dielectric layer 204 are then defined using the photoresist layer 210, followed by removing the portions of the dielectric layer 208, the stop layer 206 and the dielectric layer 204 not covered by the photoresist layer 210 to form a via opening 212a and an opening 212b where the air-gap is to be formed. Since the definition of the air-gap and the via opening use the same mask, the formation procedures for the air-gap and the via opening 212a are thus accomplished in the same photolithography and etching processes. No additional photolithography process is required to form the air-gap. The photoresist layer 210 is subsequently removed.

Figure 2C:
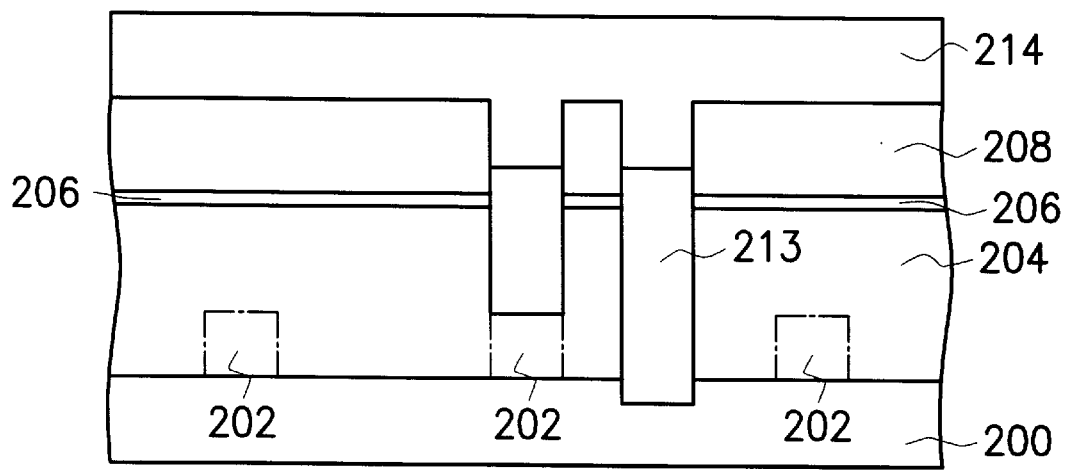

After this, as shown in FIG. 2C, a dielectric material 214 is formed on the dielectric layer 208, for example, a plasma enhanced chemical vapor deposited (PECVD) oxide layer. The recipe for forming the dielectric material 214 is adjusted during the deposition process to result in a dielectric material 214 with a slightly inferior step coverage property. The dielectric material 214 thus directly covers the dielectric layer 208, sealing the opening 212b (as in FIG. 2B) to form an air gap 213 but not completely filling the opening 212b. Furthermore, the dielectric material 214 also covers the via opening 212a, resulting in a part of the dielectric material 214 partially filling the via opening 212a. The height of the dielectric material 214 in the via opening 212a and the opening 212b is controlled to be above the stop layer 206, which is favorable not only in forming the air-gap 213, but also facilitates the manufacturing of the via plug.

Figure 2D:
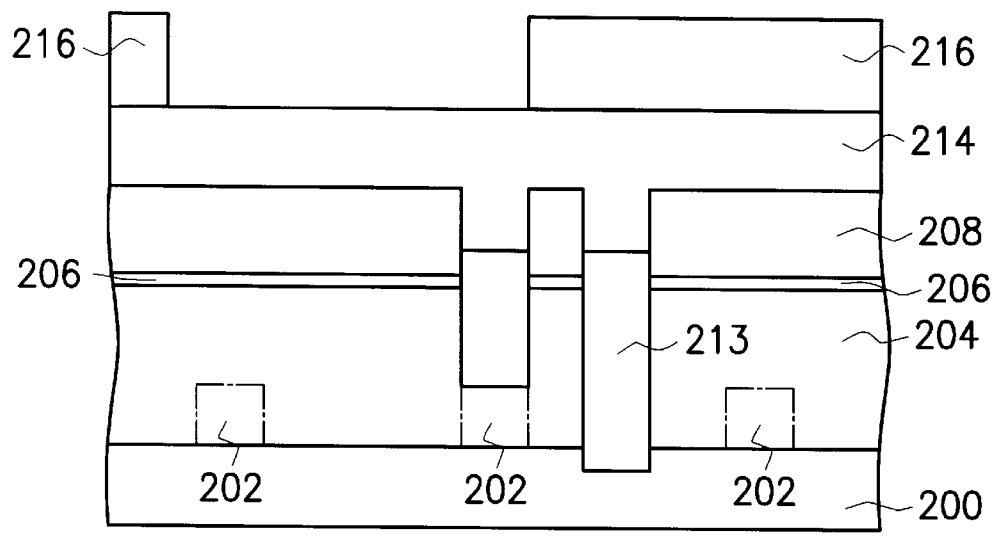
Figure 2E:
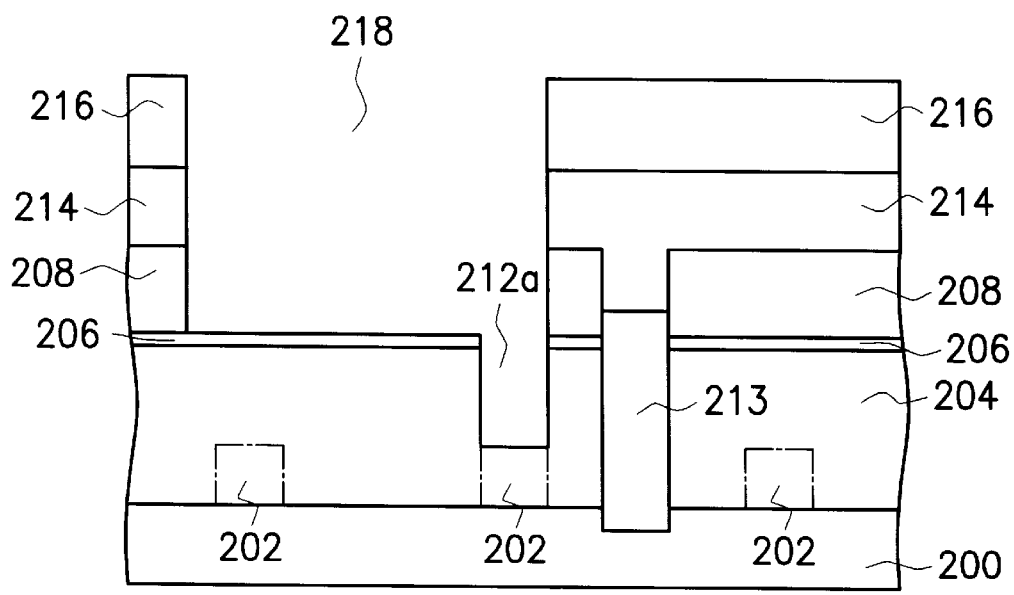

Continuing to FIG. 2D, a photoresist layer 216 is formed on the dielectric material 214 to define the dielectric material 214 and the dielectric layer 208, followed by forming a trench 218 in the dielectric material 214 and the dielectric layer 208 as illustrated in FIG. 2E. The trench 218 is formed by performing anisotropic etching on the dielectric material 214 and the dielectric layer 208 using the stop layer 206 as an etch-stop, and the dielectric layer 204 and the photoresist layer 216 as etching masks. The dielectric material 214 and the dielectric layer 208 are completely removed in the via opening 212a to expose the metal layer 202. On the other hand, the dielectric material 214 above the air-gap 213, protected by the photoresist layer 216, remains. The structure of the air-gap 213 is thereby preserved during the step of defining the trench 218. Subsequently, the photoresist layer 216 is removed.

Figure 2F:
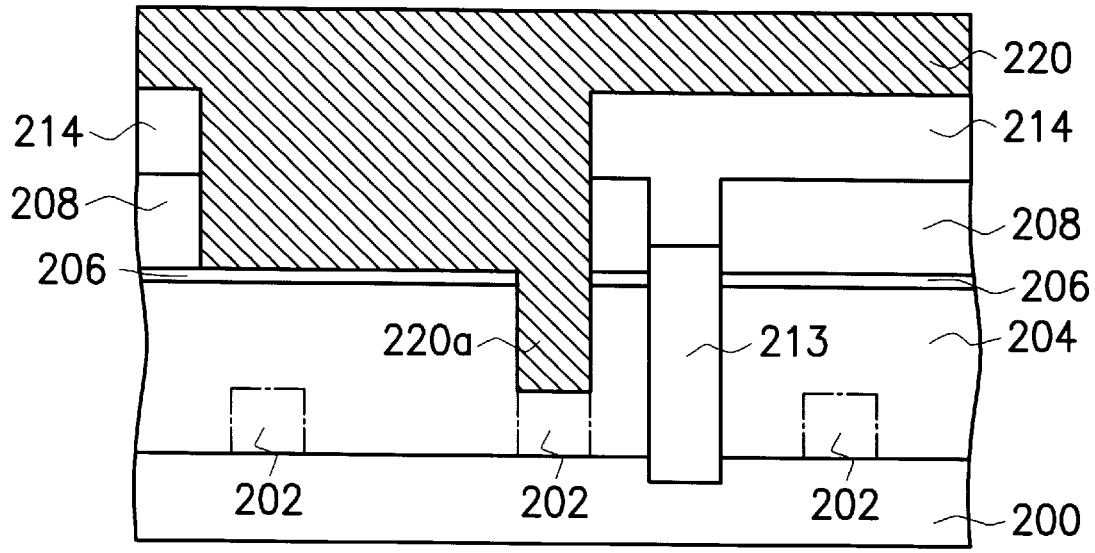
Figure 2G:
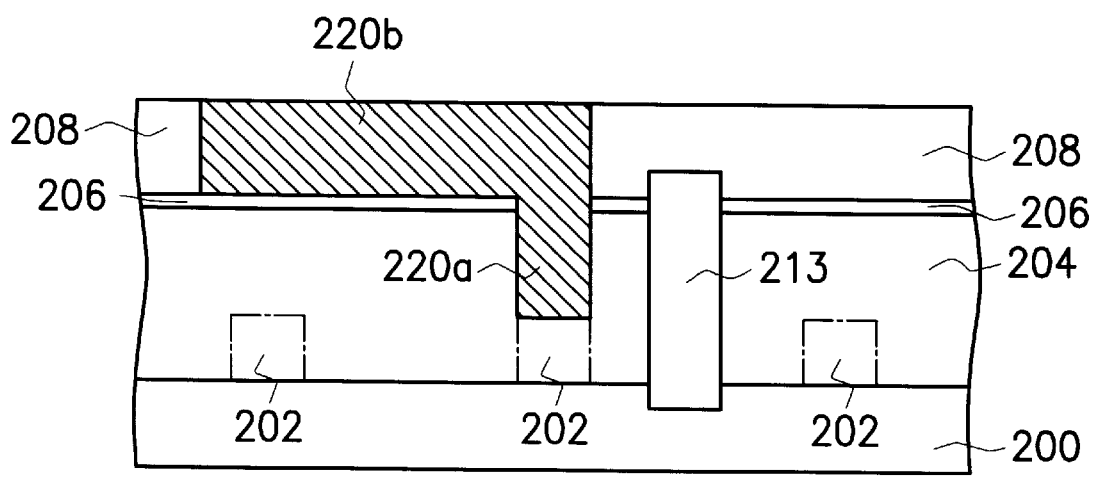

As shown in FIG. 2F, a conductive material 220, for example, a metal, is then formed, covering the dielectric material 214 and filling the via opening 212a and the trench 218 (as in FIG. 2E). After this, the conductive material 220 on the dielectric material 214 is then removed by, for example, chemical mechanical polishing to expose the dielectric material 214; or the dielectric material 214 and the conductive material 220 on the dielectric layer 208 are concurrently removed to expose the dielectric layer 208. As illustrated in FIG. 2G, a via plug 220a is then formed after filling the via opening 212a with a conductive material 220. An upper level conductive line 220b is formed by filling the trench 218 with the conductive material 220. Furthermore, the bottom level conductive line 202 is electrically connected with the upper level conductive line 220b through the via plug 220a.

According to the preferred embodiment of the present invention, the positions for the upper level conductive line and for the air-gap are defined using the same mask. Since no additional mask is required to form the air-gap, the production cost is more economical.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a dual damascene structure comprising an air-gap, which is applicable on a substrate comprising a first conductive line, the method comprising the steps of:

forming a dielectric layer on the first conductive line;

forming a via opening and a gap simultaneously, wherein the via opening exposes the first conductive line in the dielectric layer;

forming a dielectric material on the dielectric;

forming a trench in the dielectric material and the dielectric layer to expose the first conductive line; and filling the trench and the via opening with a conductive material to form a second conductive line and a via plug.

2. The fabrication method for a dual damascene structure comprising an airgap according to claim 1, wherein the dielectric layer further includes a stop layer formed thereon.

3. The fabrication method for a multilevel metal interconnect comprising an air-gap according to claim 2, wherein the step of forming the dielectric material to cover the dielectric layer further includes partially filling the via opening and the gap with the dielectric material.

4. The fabrication method for a dual damascene structure comprising an air-gap according to claim 1, wherein the trench is formed by:

defining the dielectric material and the dielectric layer using a photoresist;

etching the dielectric material and the dielectric layer using a stop layer as an etch-stop.

5. The fabrication method for a dual damascene structure comprising an air-gap according to claim 1, wherein the gap is in the dielectric layer between the first conductive line and the second conductive line.

6. The fabrication method for a dual damascene structure comprising an air-gap according to claim 1, wherein the dielectric material includes an oxide layer.

7. The fabrication method for a dual damascene structure according to claim 1, wherein the dielectric material is formed by plasma enhanced chemical vapor deposition.

8. A fabrication method for a dual damascene structure comprising an air-gap, which is applicable to a substrate comprising a metal layer, the method comprising the steps of:

sequentially forming a first dielectric layer, a stop layer and a second dielectric layer;

defining the first and the second dielectric layers to form a via opening exposing a first metal layer and to form an opening in a pre-determined position on the first and second dielectric layers, wherein the via and an opening are formed simultaneously;

forming an oxide layer on the second dielectric layer to cover the opening and to transform the opening into an air-gap;

defining the oxide layer and the second dielectric layer to form a trench that exposes the first metal layer; and forming a second metal layer and a via plug in the trench and the via opening, wherein the first metal layer and the second metal layer are electrically connected through the via plug.

9. The fabrication method for a dual damascene structure comprising an air-gap according to claim 8, wherein the oxide layer is formed by plasma enhanced chemical vapor deposition.

10. The fabrication method for a dual damascene structure comprising an air-gap according to claim 8, wherein the trench is formed by:

defining the oxide layer and the second dielectric layer with a photoresist layer;

etching the oxide layer and the second dielectric layer while using the stop layer as an etch-stop.

11. The fabrication method for a dual damascene structure comprising an air-gap according to claim 10, wherein the step of etching the oxide layer further includes removing the oxide layer in the via opening.

12. The fabrication method for a dual damascene structure comprising an air-gap according to claim 8, wherein the pre-determined position is located in the first and the second dielectric layer between the first metal layer and the second metal layer.

13. The fabrication method for a dual damascene structure comprising an air-gap according to claim 8, wherein the pre-determined position does not overlap with the first metal layer and the second metal layer.

* * * * *